United States Patent [19]

Fallon et al.

[11] Patent Number: 5,542,601
[45] Date of Patent: Aug. 6, 1996

[54] REWORK PROCESS FOR SEMICONDUCTOR CHIPS MOUNTED IN A FLIP CHIP CONFIGURATION ON AN ORGANIC SUBSTRATE

[75] Inventors: Kenneth M. Fallon, Vestal; Miguel A. Jimarez, Newark Valley; Joseph E. Zdimal, Binghamton, all of N.Y.

[73] Assignee: International Business Machines Corporation, Armonk, N.Y.

[21] Appl. No.: 394,684

[22] Filed: Feb. 24, 1995

[51] Int. Cl.$^6$ ............................................. H05K 3/34
[52] U.S. Cl. ........................ 228/119; 228/254; 228/264
[58] Field of Search ................................. 228/119, 191, 228/264, 56.3, 254, 180.22; 29/762

[56] References Cited

U.S. PATENT DOCUMENTS

| | | | |
|---|---|---|---|
| 3,731,866 | 5/1973 | Mason et al. | 228/6.2 |
| 4,416,408 | 11/1983 | Spirig | 228/264 |
| 4,832,249 | 5/1989 | Ehler | 228/264 |
| 5,072,874 | 12/1991 | Bertram et al. | 228/264 |
| 5,147,084 | 9/1992 | Behun et al. | 228/56.3 |
| 5,284,286 | 2/1994 | Brofman et al. | 228/264 |
| 5,392,980 | 2/1995 | Swamy et al. | 228/119 |

FOREIGN PATENT DOCUMENTS 54-162465  12/1979  Japan ..................................... 228/119

OTHER PUBLICATIONS

IBM Technical Disclosure Bulletin, "Replacement Pads for SMT Components on Printed Circuit Boards", vol. 33, No. 3A, pp. 213–214, Aug., 1990.
IBM Technical Disclosure Bulletin vol. 16, No. 4, Sep. 9, 1973, "Accurate Chip Placement on a Substrate", p. 1154, by DeBoskey et al.
IBM TDB vol. 24, No. 7A, Dec. 1981, "Use of a Tinned Copper Slug for Module Reworking", p. 3481, by Le Pape.
IBM TDB vol. 27, No. 12, May 1985, "Laser Individual Chip Rework System", p. 7110, by Druschel et al.

*Primary Examiner*—Samuel M. Heinrich
*Attorney, Agent, or Firm*—Bernard Tiegerman

[57] ABSTRACT

A new rework process for semiconductor chips mounted in a flip chip configuration, via solder balls, on an organic substrate is disclosed.

10 Claims, 3 Drawing Sheets

REWORK PROCESS FOR SEMICONDUCTOR CHIPS MOUNTED IN A FLIP CHIP CONFIGURATION ON AN ORGANIC SUBSTRATE

BACKGROUND OF THE INVENTION

1. Field of the Invention

The invention involves a process for removing defective semiconductor chips, mounted in a flip chip configuration, from an organic substrate, such as an organic printed circuit board, and replacing the defective semiconductor chips with functional semiconductor chips.

2. Description of the Related Art

One method for packaging a semiconductor integrated circuit device (hereinafter referred to as a semiconductor chip or just chip) involves attaching solder balls to contact pads on the circuit-bearing surface of the chip. These solder balls have compositions which include, for example, 97% (by weight) Pb and 3% (by weight) Sn, with the corresponding melting temperature being 320 degrees C. This chip is then placed face-down, in the so-called flip chip configuration, onto a ceramic, e.g., alumina, substrate, with the solder balls being placed onto solderable metal contact pads on the ceramic substrate. Sufficient heat is then applied to melt the solder balls. Upon cooling and re-solidification, the solder balls serve to mechanically and electrically connect the chip to the ceramic substrate, resulting in what is commonly referred to as a ceramic chip carrier. The ceramic chip carrier is then mounted onto a printed circuit board (PCB) or printed circuit card (PCC) using, for example, a lead frame.

Another method for packaging a semiconductor chip involves mounting the chip, in the flip chip configuration, directly onto a PCB or PCC, which is conventionally comprised of organic materials such as the epoxy resin/fiberglass compositions sold under the trade names FR4 and DriClad, as well as polytetrafluoroethylene (PTFE)-based materials. As before, solder balls are attached to contact pads on the circuit-bearing surface of the chip, the solder balls having compositions which include, for example, 97% (by weight) Pb and 3% (by weight) Sn. Again as before, the solder balls attached to the chip are to be attached to corresponding solderable metal contact pads on the PCB or PCC. However, in this instance, such attachment is not achieved by melting the solder balls because the organic materials comprising the PCB or PCC are incapable of withstanding the temperatures needed to achieve solder ball melting. Rather, a region of Pb-Sn solder having the eutectic composition, i.e., 63% (by weight) Pb and 37% (by weight) Sn, is first applied to each solderable metal contact pad on the PCB or PCC. The solder balls attached to the chip are then brought into contact with the eutectic solder on the PCB or PCC, and tile eutectic solder is then heated to its melting temperature of 183 degrees C., which has no adverse effects on the organic materials comprising the PCB or PCC. Upon cooling and re-solidification, the eutectic solder serves to mechanically and electrically connect the solder balls on the chip to the contact pads on the PCB or PCC.

When mounting a chip onto a substrate, the mounting process should preferably take into account the possibility of rework, i.e., the possibility that the chip may be defective, and will therefore have to be removed and replaced with a functional chip. In this regard, until recently, the solder balls on chips which have been mounted directly onto PCBs or PCCs have been arranged in grids having relatively large pitches, e.g., pitches of 14 mils. In addition, the solderable metal contact pads on the corresponding PCBs or PCCs have had relatively large dimensions, e.g., lengths and widths of, for example, 5 mils by 6 mils. This has permitted a relatively large amount of eutectic solder, e.g., 80 cubic mils of solder, having a mean thickness of 1 mil, to be applied to each solderable metal contact pad of a PCB or PCC when initially mounting a chip onto the PCB or PCC. Such an amount, while significantly more than is needed to achieve chip mounting, is advantageous because it permits ready rework. That is, if the mounted chip is found to be defective, in the conventional rework process, the eutectic solder connecting the chip solder balls to the contact pads of the PCB or PCC is heated to its melting temperature. Then, the defective chip, with its unmelted solder balls, is pulled off the PCB or PCC. This does result in the removal of some of the eutectic solder. However, the volume and mean thickness of the remaining eutectic solder is more than adequate to permit a new, functional chip to be directly mounted onto the PCB or PCC, without skewing or tilting the chip, using just the eutectic solder remaining on the contact pads.

Just recently, the pitches of the solder ball grids on chips to be directly mounted onto PCBs or PCCs have been reduced in size to, for example, 9 mils. In addition, the dimensions of the solderable metal contact pads on the corresponding PCBs or PCCs have also been reduced to, for example, 3 mils by 5 mils. For reasons discovered by the present inventors, discussed below, the conventional rework process, described above, is no longer useful for such relatively small solder ball grid pitches and/or relatively small contact pads. Instead, a new rework process has been developed by the present inventors, which is described below.

SUMMARY OF THE INVENTION

The present inventors have discovered that the conventional rework process used in connection with chips mounted in a flip chip configuration on a PCB or PCC is undesirable where the chips have solder ball grid pitches smaller than 14 mils, e.g., 9 mils, and/or where the dimensions of the contact pads on the corresponding PCB or PCC are smaller than 5 mils by 6 mils, e.g., 3 mils by 5 mils. That is, the present inventors have discovered that initially providing a relatively large volume of solder, e.g., 80 cubic mils, on each contact pad of a PCB or PCC, some of which is to be used during rework, is undesirable where the corresponding solder ball grid pitches and/or contact pads are relatively small because this often leads to undesirable solder bridging between adjacent solder balls and/or adjacent contact pads, which leads to undesirable short circuits.

In addition to the above discovery, the present inventors have also developed a new rework process which avoids the above-described, undesirable solder bridging phenomenon. In a first embodiment of the new rework process, the eutectic solder connecting the solder balls on a defective chip to the contact pads on an organic substrate, such as a PCB or a PCC, is heated to the eutectic temperature and melted. The defective chip, with its attached solder balls, is removed from the organic substrate, which also results in the removal of some of the eutectic solder from the contact pads on the organic substrate. Substantially all of the eutectic solder remaining on the contact pads of the organic substrate is then also removed. A decal, bearing a pattern of eutectic solder regions corresponding to the pattern of contact pads on the organic substrate, is used to apply a preselected amount of eutectic solder to each contact pad on the organic substrate.

This preselected amount is chosen in relation to tile solder ball grid pitch and the dimensions of the contact pads so as to permit rework, while avoiding solder bridging. The solder balls attached to the contact pads of a functional chip are then brought into contact with the preselected amounts of eutectic solder applied to the contact pads on the organic substrate. The preselected amounts of eutectic solder are then melted. Upon cooling and re-solidification, the preselected amounts of eutectic solder serve to mechanically and electrically connect the solder balls attached to the chip to the contact pads on the organic substrate.

A second embodiment of the new rework process differs from the first embodiment in that a decal is not used to apply a preselected amount of eutectic solder to each contact pad on the organic substrate. Rather, a preselected amount of, for example, tin is evaporated onto each solder ball of the functional chip which is to replace the defective chip. These tin-bearing solder balls are then placed into contact with the contact pads (or the relatively small amount of eutectic solder remaining on the contact pads ) of the organic substrate. The tin-bearing solder balls are then heated to the Pb-Sn eutectic temperature. This results in the evaporated tin combining with the Pb in the solder balls to form preselected amounts of (liquid) eutectic Pb-Sn solder beneath the solder balls. Upon cooling and re-solidification, the eutectic solder serves to mechanically and electrically connect the solder balls attached to the chip to the contact pads on the organic substrate.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves the finding that the conventional rework process used in connection with semiconductor chips mounted in the flip chip configuration, via solder balls, on an organic substrate leads to undesirable solder bridging between adjacent solder balls and/or between adjacent contact pads on the organic substrate, if the solder ball grid pitches associated with the chips is relatively small and/or the dimensions of the contact pads on the organic substrate are relatively small. In addition, the invention involves a new rework process which avoids undesirable solder bridging.

Figure 1:
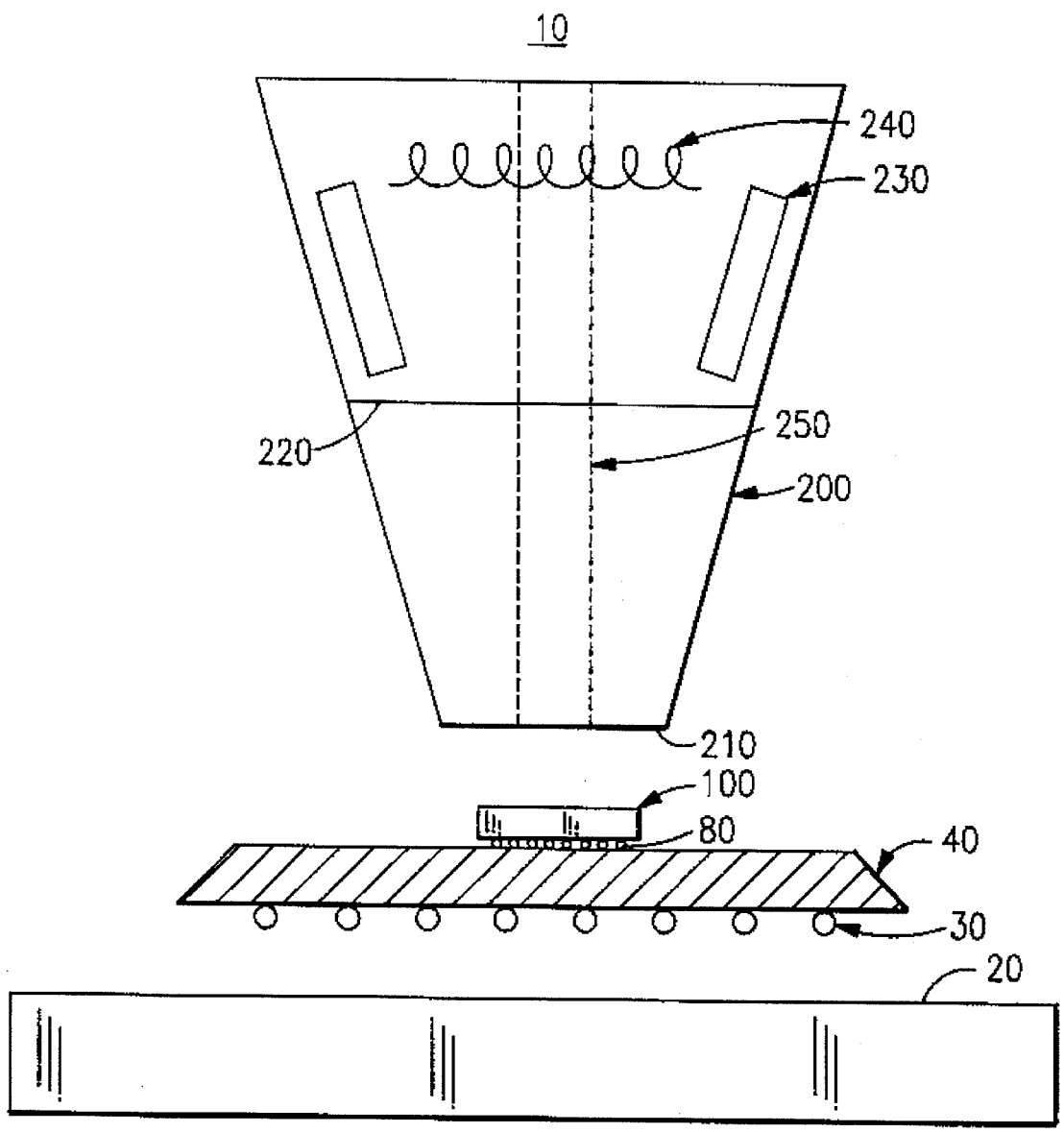
FIG. 1 is a cross-sectional view of apparatus useful in carrying out the inventive rework process.

With reference now to FIG. 1, a preferred embodiment of apparatus 10 which is useful in implementing the inventive rework process includes a hot plate 20, which serves to support and heat an organic substrate 40 (which is not a part of the apparatus 10, per se), such as an organic PCB or PCC, of interest. The hot plate 20 is fabricated from, for example, aluminum, and is preferably electrically heated. As discussed more fully below, the hot plate 20 serves to heat the organic substrate 40 to a temperature of, for example, 115 degrees C.

As shown in FIG. 1, the organic substrate 40 is preferably only indirectly supported by the hot plate 20. That is, circular cylindrical support rods 30 fabricated from, for example, stainless steel, are preferably positioned between the organic substrate 40 and hot plate 20. The cross-sectional diameters of the support rods 30 are, for example, 125 mils.

Obviously, the organic substrate 40, which is to be processed with the apparatus 10, bears at least one semiconductor chip 100. This chip is naturally mounted in the flip chip configuration on the organic substrate 40, via solder balls 80.

Significantly, the apparatus 10 also includes a (hollow) funnel 200, which is fabricated from, for example, stainless steel. In vertical cross-section, the funnel 200 is frusto-conical in shape, while in horizontal cross-section, the funnel 200 is preferably rectangular in shape. When properly oriented, the funnel 200 is inverted, with the relatively narrow end 210 of the funnel 200 being positioned closer to the organic substrate 40 than the relatively wide end 220 of the funnel 200. It must be noted that the relatively narrow end 210 must have length and width dimensions which are larger than the length and width dimensions of the semiconductor chip 100.

Contained within the funnel 200 are four hot gas (HG) nozzles 230, located at the four corners of the funnel 200, which serve to produce four streams of heated inert gas, e.g., heated nitrogen gas. The volumetric flow rate associated with each of these four HG nozzles is, for example, 100 cubic feet per hour and the temperature of the heated inert gas is, for example, 250 degrees C. Also contained within the funnel 200 are two infra-red (IR) lamps 240, having a wattage rating of, for example, 500 watts. The four HG nozzles 230 and two IR lamps 240 are used as heat sources in the inventive rework process, described below. The funnel 200 containing the four HG nozzles and two IR lamps 240 serves to direct, and limit, the heating produced by the four HG nozzles and two IR lamps to a semiconductor chip site of interest.

Centrally located within the funnel 200 is a vacuum pickup tube 250. As discussed more fully below, the vacuum pickup tube 250 is used to pick up, remove and place semiconductor chips, and other objects, during the inventive rework process.

Figure 2A:
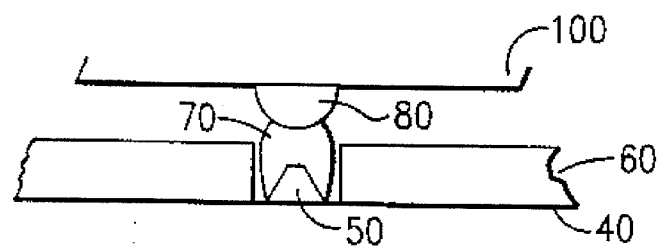
FIGS. 2(a)–2(g) depict the steps involved in a first embodiment of the inventive rework process.

With reference now to FIG. 2(a), and as noted above, a defective semiconductor chip 100, which is to be removed and replaced with a functional chip via the inventive rework process, is assumed to be mounted in a flip chip configuration on an organic substrate, e.g., a PCB or PCC, 40. In particular, it is assumed that the organic substrate 40 includes a plurality of solderable metal, e.g., copper, contact pads 50 at the corresponding chip site, and each of these contact pads 50 is encircled by a solder mask 60. It is also assumed that the defective chip 100 includes a corresponding plurality of chip contact pads 90 (not shown). It is further assumed that a region of solder 80, having a relatively high melting temperature, e.g., a region of solder comprising 97% (by weight) Pb and 3% (by weight) Sn, is attached to each chip contact pad 90. (Although the solder regions 80 are generally not spherical in shape, for the sake of convenience, these solder regions 80 are herein referred to as solder balls 80.) It is still further assumed that each solder ball 80 is mechanically and electrically connected to a contact pad 50 on the organic substrate 40 via a region of solder 70 having a relatively low melting temperature, e.g., a region of solder having the Pb-Sn eutectic composition.

Figure 2B:
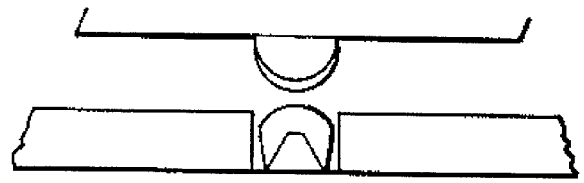

With reference now to FIG. 2(b), in a first embodiment of the inventive rework process, the hot plate 20 is initially used to heat the organic substrate 40 to a temperature which is higher than room temperature but lower than the melting temperature of the solder regions 70, e.g., a temperature of 115 degrees C. While this heating continues, the funnel 200 is then lowered until the narrow end 210 of the funnel 200 is directly over the chip 100. The four HG nozzles 230 and/or two IR lamps 240 are then used to heat the chip 100 to the melting temperature of the solder regions 70, e.g., 183 degrees C., for a period of, for example, 20 seconds. The pickup tube 250 is then used to pick up and remove the defective chip 100, with its unmelted and attached solder balls 80. This necessarily results in the removal of some, but less than all, of the solder regions 70.

Figure 2C:
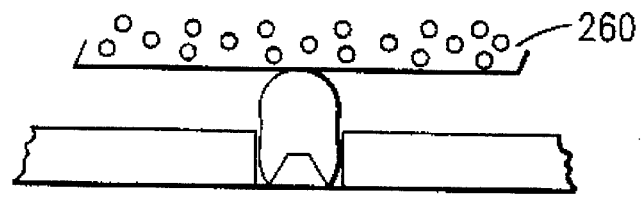
Figure 2D:

As shown in FIG. 2(c), the pickup tube 250 is now used to place a metallic, e.g., copper, block 260 directly over, and into contact with, the solder regions 70 remaining on the contact pads 50 of the organic substrate 40. Significantly, this metallic block 260 includes a layer of eutectic Sn/Pb, having a thickness of, for example, 1 mil, on the surface which contacts the solder regions 70. This layer of eutectic Sn/Pb results in the metallic block 260 being readily wetted by the solder regions 70. While the metallic block 260 is in contact with the solder regions 70, the hot plate 20 heats the organic substrate 40 and the four HG nozzles 230 and/or two IR lamps are used to heat the metallic block 260, and therefore the underlying solder regions 70. Preferably, this heating of the metallic block 260 continues for a period of, for example, 10 seconds, at which point the solder regions 70 are molten. At this point, substantially all (but less than 100%) of the molten solder regions 70 adhere to the metallic block 260, which is then removed (along with the adhering molten solder regions 70) with the pickup tube 250. The resulting chip site then has the appearance pictured in FIG. 2(d).

Figure 2E:
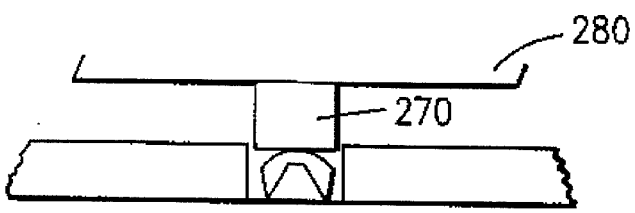

With reference now to FIG. 2(e), the next step in the first embodiment of the inventive rework process involves the placement of a preselected amount of solder 270 on each contact pad 50 on the organic substrate 40. The solder 270 is chosen to have a relatively low melting point (lower than that of the solder balls 80), e.g., the solder 270 is chosen to have the Pb-Sn eutectic composition, which has a melting point of 183 degrees C. Moreover, as more fully discussed below, the amount of solder 270 placed on each contact pad 50 is chosen so as to permit rework, while avoiding undesirable solder bridging.

In accordance with the first embodiment, the placement of a preselected amount of solder 270 on each contact pad 50 on the organic substrate 40 is achieved through the use of a decal 280. This decal 280 includes a metallic, e.g., stainless steel, layer bearing preselected amounts of solder 270 arranged in a pattern corresponding to the pattern of contact pads 50 on the organic substrate 40. Such a decal is readily formed by applying a layer of photoresist to the metallic layer and exposing and developing the photoresist to form a pattern of openings in the photoresist corresponding to the pattern of contact pads 50. The desired solder composition is then deposited, e.g., electroplated, into the openings in the photoresist and onto the photoresist. Removal of the photoresist results in the desired decal 280.

Figure 2F:
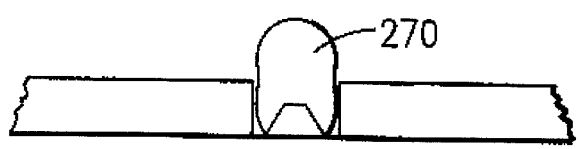

As should now be obvious, the decal 280 is picked up with the pickup tube 250 and positioned over the contact pads 50 on the organic substrate 40, with the solder regions 270 touching the contact pads 50 (or the solder regions 70 remaining on the contact pads 50). While in this position, the hot plate 20 heats the organic substrate 40 and the four HG nozzles 230 and/or two IR lamps heat the decal 280. Such heating is continued for a period of, for example, 40 seconds, at which point the solder regions 270 become molten and transfer onto the contact pads 50. The resulting chip site then has the appearance pictured in FIG. 2(f).

Figure 2G:
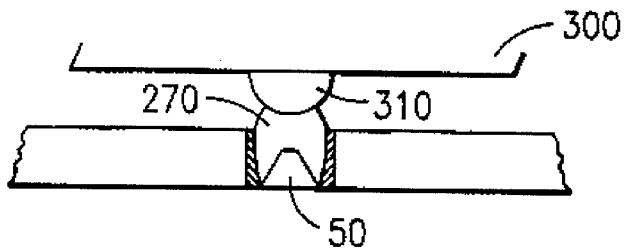

The last steps in the first embodiment of the inventive rework process initially involve applying a fluxing agent to the solder regions 270 and contact pads 50. Then, the pickup tube 250 is used to place a functional semiconductor chip 300, bearing solder balls 310, onto the chip site just vacated by the defective chip 100. As should be obvious, the solder balls 310 are placed in contact with the solder regions 270, and the hot plate 20 and four HG nozzles 230 and/or two IR lamps are used to provide heat so as melt the solder regions 270. Upon cooling and re-solidification, the solder regions 270 serve to mechanically and electrically connect the solder balls 310 to the contact pads 50 on the organic substrate 40. The resulting chip site has the appearance pictured in FIG. 2(g).

As noted, the preselected amount of solder 270 to be deposited onto each contact pad 50 is chosen so as to achieve rework, while avoiding undesirable solder bridging. In general, this choice is dependent on both solder ball grid pitch and on the dimensions, and therefore the areas, of the contact pads 50. Consequently, in general, the preselected amount is most conveniently determined empirically by varying the preselected amount. That is, a relatively large volume of solder 270 is initially applied to each of the contact pads 50 (having the desired sizes), a functional chip (having the desired solder ball grid pitch) is mounted on the solder regions 270, the solder regions 270 are melted and cooled, and adjacent solder balls and contact pads are then physically examined to detect the presence of solder bridging. Alternatively, electrical tests are performed to detect the presence of corresponding short circuits. If solder bridging, or short circuits, are detected, then the volume of solder 270 is reduced, until no solder bridging is detected, or no short circuits are detected.

By way of example, it has been found, using the above-described empirical procedure, that where the solder ball grid pitch is 9 mils and the surface area of each contact pad 50 is 15 square mils (3 mils by 5 mils), then rework is readily achievable and solder bridging is avoided provided the volume of each solder region 270 is, for example, 40 cubic mils. Significantly, when such a solder volume is used in rework, i.e., deposited onto a contact pad 50 and then used to achieve a mechanical and electrical connection to a solder ball of a functional chip, that the thickness of this solder volume, measured from the contact pad to the solder ball, has a mean value of 1.74 mils, with a corresponding standard deviation of 0.31 mils. This is to be contrasted with chips which have not undergone rework, where the thickness of the solder region 70 has a mean value of 1.58 mils and a corresponding standard deviation of 0.12 mils.

Figure 3A:
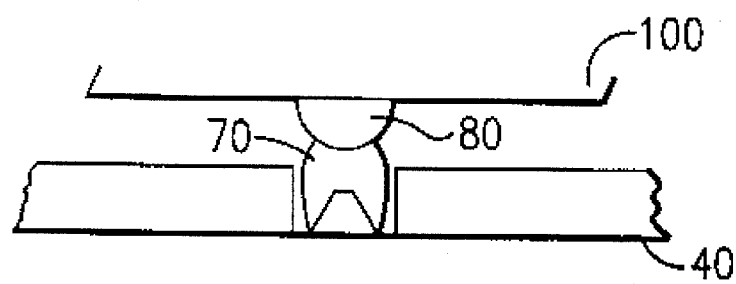
FIGS. 3(a)–3(f) depict the steps involved in a second embodiment of the inventive rework process.
Figure 3B:
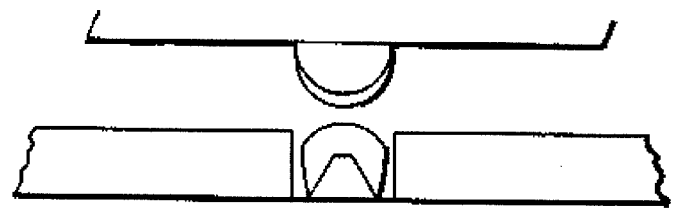
Figure 3C:
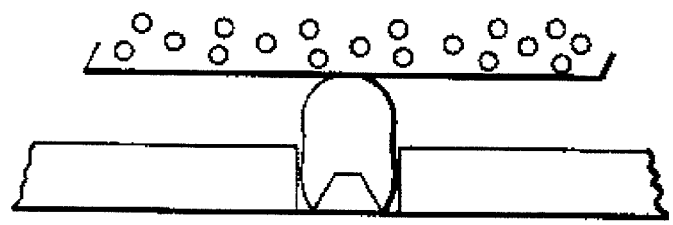
Figure 3D:
Figure 3E:
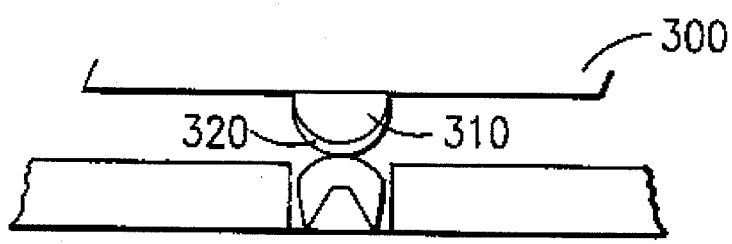
Figure 3F:
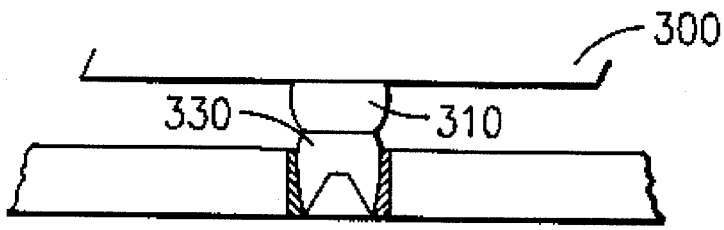

The first three steps of a second embodiment of the inventive rework process are the same as the first three steps of the first embodiment, as shown in FIGS. 3(a)–3(d). The second embodiment differs from the first embodiment in that a decal is not used to apply a preselected amount of solder 270 to each contact pad 50 on the organic substrate 40. Rather, if each solder ball 310 of the functional chip 300 has a composition which includes, for example, 97% (by weight) Pb and 3% (by weight) Sn, then a layer 320 of Sn is deposited, e.g., rf evaporated, onto each of the solder balls 310. The pickup tube 250 is then used to position the resulting functional chip 300 over the chip site, with each layer 320 of Sn in contact with a corresponding contact pad 50 (or the relatively small amount of solder 70 still remaining on the contact pad 50), as depicted in FIG. 3(e). Then, the temperature of the chip site is raised to the Pb-Sn eutectic temperature, i.e., 183 degrees C., using the hot plate 20 and four HG nozzles 230 and/or two IR lamps 240. This results in the Sn in each layer 320 combining with the Pb in the corresponding solder ball 310, to form a volume 330 of (liquid) eutectic solder composition, i.e., a composition which includes 63% (by weight) Pb and 37% (by weight) Sn, as depicted in FIG. 3(*f*). Upon cooling and solidification, the solder 330 serves to mechanically and electrically connect each solder ball 310 to the corresponding contact pad 50.

In the second embodiment, the thickness of the layer 320 of Sn, and therefore the volume of eutectic solder 330, is conveniently determined empirically, using the method described above. If the solder ball grid pitch is 9 mils and the surface area of each contact pad 50 is 15 square mils (3 mils by 5 mils), then by using the empirical procedure, it has been found that rework is readily achievable and solder bridging avoided if the volume of solder 330 is, for example, 20 cubic mils. When such a volume is used in rework, the resulting thickness of this solder volume, measured from the contact pad to the solder ball, has a mean value of 1.44 mils and a corresponding standard deviation of 0.27 mils. By contrast, if the procedure used in the second embodiment is used to initially mount a chip in the flip chip configuration, then the thickness of the solder volume has a mean value of 0.5 mils and a corresponding standard deviation of 0.11 mils.

While the invention has been particularly shown and described with reference to preferred embodiments thereof, it will be understood by those skilled in the art that various changes in form and details may be made therein without departing from the spirit and scope of the invention.

We claim:

1. A rework process for a defective semiconductor chip attached via a plurality of solder regions to contact pads on an organic substrate, where each of said plurality includes a first solder region, having a first, relatively high melting temperature, in physical contact with a contact pad of said chip, and a second solder region, having a second, relatively low melting temperature, in physical contact with a contact pad of said organic substrate, comprising the steps of:

heating each of said plurality of solder regions to at least said second melting temperature;

removing said defective chip, including at least the first solder region of each of said plurality of solder regions, from said organic substrate;

removing substantially all of said plurality of solder regions remaining on said contact pads of said organic substrate;

applying a preselected amount of solder, having said second melting temperature, to each of said contact pads of said organic substrate;

bringing a plurality of solder regions, attached to contact pads of a functional semiconductor chip and having said first melting temperature, into contact with the solder applied to said contact pads of said organic substrate; and heating said solder applied to said contact pads of said organic substrate to said second melting temperature.

2. The rework process of claim 1, wherein said step of removing substantially all of said plurality of solder regions remaining on said contact pads of said organic substrate includes the step of placing a metallic block in contact with said plurality of solder regions remaining on said contact pads of said organic substrate, said metallic block having a surface adapted to be wetted by said plurality of solder regions remaining on said contact pads of said organic substrate.

3. The rework process of claim 1, wherein said applying step includes the step of bringing a metallic layer, bearing a plurality of preselected amounts of solder in a pattern corresponding to that of the contact pads of said organic substrate, into proximity with said contact pads of said organic substrate and heating said plurality of preselected amounts of solder.

4. The rework process of claim 1, wherein said organic substrate is a printed circuit board.

5. The rework process of claim 1, wherein said organic substrate is a printed circuit card.

6. A rework process for a defective semiconductor chip attached via a first plurality of solder regions to contact pads on an organic substrate, where each of said first plurality includes a first solder region, having a first, relatively high melting temperature, in physical contact with a contact pad of said chip, and a second solder region, having a second, relatively low melting temperature, in physical contact with a contact pad of said organic substrate, comprising the steps of:

heating each of said first plurality of solder regions to at least said second melting temperature;

removing said defective chip, including at least the first solder region of each of said first plurality of solder regions, from said organic substrate;

removing substantially all of said first plurality of solder regions remaining on said contact pads of said organic substrate;

bringing a second plurality of solder regions, attached to contact pads of a functional semiconductor chip, into proximity with said contact pads of said organic substrate, each of said second plurality including third and fourth solder regions, each of said third solder regions exhibiting said first melting temperature and each of said fourth solder regions exhibiting a melting temperature different from either said first melting temperature or said second melting temperature; and modifying each of said fourth solder regions to exhibit a melting temperature substantially equal to said second melting temperature.

7. The rework process of claim 6, wherein said modifying step includes the step of heating said second plurality of solder regions to said second melting temperature.

8. The rework process of claim 6, wherein said step of removing substantially all of said first plurality of solder regions remaining on said contact pads of said organic substrate includes the step of placing a metallic block in contact with said first plurality of solder regions remaining on said contact pads of said organic substrate, said metallic block having a surface adapted to be wetted by said first plurality of solder regions remaining on said contact pads of said organic substrate.

9. The rework process of claim 6, wherein said organic substrate is a printed circuit board.

10. The rework process of claim 6, wherein said organic substrate is a printed circuit card.

* * * * *